US009552867B2

(12) United States Patent
Sohn et al.

(10) Patent No.: US 9,552,867 B2
(45) Date of Patent: Jan. 24, 2017

(54) SEMICONDUCTOR MEMORY DEVICES AND MEMORY SYSTEMS INCLUDING THE SAME

(71) Applicant: Samsung Electronics Co., Ltd., Suwon-si (KR)

(72) Inventors: Young-Soo Sohn, Seoul (KR); Uk-Song Kang, Seongnam-si (KR); Kwang-Il Park, Yongin-si (KR); Chul-Woo Park, Yongin-si (KR); Hak-Soo Yu, Seongnam-si (KR); Jae-Youn Youn, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 37 days.

(21) Appl. No.: 14/588,496

(22) Filed: Jan. 2, 2015

(65) Prior Publication Data

US 2015/0309743 A1    Oct. 29, 2015

(30) Foreign Application Priority Data

Apr. 28, 2014  (KR) .................. 10-2014-0050659

(51) Int. Cl.
| G06F 3/06 | (2006.01) |
| G11C 11/408 | (2006.01) |
| G11C 5/02 | (2006.01) |
| G11C 7/02 | (2006.01) |

(52) U.S. Cl.
CPC ........... *G11C 11/4087* (2013.01); *G11C 5/025* (2013.01); *G11C 7/02* (2013.01); *G11C 11/4085* (2013.01)

(58) Field of Classification Search
CPC .... G06F 3/0619; G06F 3/0665; G06F 3/0689; G11C 8/08; G11C 8/12; G11C 11/408; G11C 11/4085; G11C 11/4087; G11C 8/10; G11C 5/025; G11C 7/02
See application file for complete search history.

(56) References Cited

U.S. PATENT DOCUMENTS

| 5,687,132 | A | * | 11/1997 | Rao .................. G11C 7/18 365/221 |
| 5,923,605 | A |   | 7/1999 | Mueller et al. |
| 6,477,630 | B2 |   | 11/2002 | Ji et al. |
| 6,496,442 | B2 |   | 12/2002 | Koyanagi et al. |
| 6,587,391 | B2 |   | 7/2003 | Jung et al. |
| 7,151,711 | B2 |   | 12/2006 | Hardee |
| 7,420,867 | B2 |   | 9/2008 | Brox |

(Continued)

FOREIGN PATENT DOCUMENTS

KR    10-2007-0093750 A    9/2007

*Primary Examiner* — Hashem Farrokh
(74) *Attorney, Agent, or Firm* — Muir Patent Law, PLLC

(57) ABSTRACT

A semiconductor memory device includes a control logic and a memory cell array in which a plurality of memory cells are arranged. The memory cell array includes a plurality of bank arrays, and each of the plurality of bank arrays includes a plurality of sub-arrays. The control logic controls an access to the memory cell array based on a command and an address signal. The control logic dynamically sets a keep-away zone that includes a plurality of memory cell rows which are deactivated based on a first word-line when the first word-line is enabled. The first word-line is coupled to a first memory cell row of a first sub-array of the plurality of sub-arrays. Therefore, increased timing parameters may be compensated, and parallelism may be increased.

17 Claims, 18 Drawing Sheets

(56) References Cited

U.S. PATENT DOCUMENTS

| | | | |
|---|---|---|---|
| 7,663,951 B2 | 2/2010 | Park | |
| 7,764,565 B2 | 7/2010 | Faue | |
| 7,782,703 B2* | 8/2010 | Oh | G11C 8/12 |
| | | | 365/230.03 |
| 2005/0052913 A1* | 3/2005 | Brox | G11C 7/22 |
| | | | 365/202 |
| 2013/0039135 A1* | 2/2013 | Kang | G11C 7/1009 |
| | | | 365/189.16 |

* cited by examiner

SEMICONDUCTOR MEMORY DEVICES AND MEMORY SYSTEMS INCLUDING THE SAME

CROSS-REFERENCE TO RELATED APPLICATION(S)

This U.S. non-provisional application claims the benefit of priority under 35 USC §119 to Korean Patent Application No. 10-2014-0050659, filed on Apr. 28, 2014, in the Korean Intellectual Property Office, the contents of which are incorporated herein in their entirety by reference.

BACKGROUND

1. Technical Field

Example embodiments relate to memory devices, and more particularly to semiconductor memory devices and memory systems including the same.

2. Discussion of the Related Art

A memory device operates according to specifications of timing parameters such as a memory cell data write time, a word-line activation time, and a precharge time. Timing parameters increase as a semiconductor process shrinks, thereby reducing semiconductor yield. As the semiconductor process tends to shrink, the semiconductor yield may be more and more reduced.

SUMMARY

Some example embodiments may provide a semiconductor memory device capable of compensating for increased timing parameters and increasing a parallelism efficiency.

Some example embodiments may provide a memory system including the semiconductor memory device.

According to example embodiments, a semiconductor memory device may include a control logic and a memory cell array in which a plurality of memory cells are arranged. The memory cell array may include a plurality of bank arrays, and each of the plurality of bank arrays may include a plurality of sub-arrays. The control logic may control an access to the memory cell array based on a command and an address signal. The control logic may dynamically set a keep-away zone that includes a plurality of memory cell rows which are deactivated based on a first word-line when the first word-line is enabled. The first word-line may be coupled to a first memory cell row of a first sub-array of the plurality of sub-arrays. A first row cycle for the first word-line may be at least partially overlapped with a second row cycle for a second word-line. The second word-line may be coupled to a second memory cell row in a second sub-array among the plurality of sub-arrays. The second sub-array may belong to regions other than the keep-away zone.

In example embodiments, the control logic may set a region including memory cell rows disposed within a first distance from the first word-line as the keep-away zone, based on the address signal.

In example embodiments, the control logic may divide the plurality of sub-arrays into a plurality of sub-array groups based on at least one bit of the address signal and the plurality of sub-array groups may include a first sub-array group. The control logic may set sub-array groups adjacent to the first sub-array group including the first memory cell row as the keep-away zone.

The control logic may set the first sub-array group including the first memory cell row as an activated sub-array group.

A size of each sub-array group may be varied by a mode register set.

A size of the activated sub-array group may be varied by a mode register set.

The at least one bit of the address signal may be one or more upper bits of a row address of the address signal.

In example embodiments, a precharge time of the first row cycle may be partially overlapped with a word-line enable time of the second row cycle.

In example embodiments, the semiconductor memory device may further include a plurality of row decoders. Each of the plurality of row decoders may be coupled to a corresponding bank array among the plurality of bank arrays. Each of the plurality of row decoders may include a decoder, and a plurality of word-line drivers. Each of the plurality of word-line drivers may be connected to a corresponding sub-array among the plurality of sub-arrays. The decoder may decode a row address of the address signal to provide a decoded row address. The decoder may commonly apply the decoded row address to the plurality of word-line drivers. The control logic may commonly apply an active signal that selects each of the plurality of sub-arrays to the plurality of word-line drivers, and may individually apply to the plurality of word-line drivers precharge signals that reset the plurality of word-line drivers.

The active signal and the decoded row address may be pulse-type signals.

Each of the plurality of word-line drivers may include a first p-channel metal oxide semiconductor (PMOS) transistor coupled between a power supply voltage and a first node connected to a corresponding word-line, a first n-channel metal oxide semiconductor (NMOS) transistor and a second NMOS transistor coupled in series between the first node and a ground voltage, and a latch coupled to the corresponding word-line. The latch may latch the active signal until the precharge signal is applied.

The PMOS transistor may have a gate that receives an inverted version of the precharge signal, the first NMOS transistor may have a gate that receives the active signal, and the second NMOS transistor may have a gate that receives the decoded row address.

According to example embodiments, a memory system may include a semiconductor memory device and a memory controller. The semiconductor memory device may store data. The semiconductor memory device may include a memory cell array and a control logic. The memory cell array may include a plurality of bank arrays, and each of the plurality of bank arrays may include a plurality of sub-arrays. The control logic may control an access to the memory cell array based on a command and an address signal, and the control logic may dynamically set a keep-away zone. The memory controller may control the semiconductor memory device. The keep-away zone may include a plurality of memory cell rows which are deactivated based on a first word-line when the first word-line is enabled, and the first word-line may be coupled to a first memory cell row of a first sub-array among the plurality of sub-arrays.

In example embodiments, a first row cycle for the first word-line may be at least partially overlapped with a second row cycle for a second word-line. The second word-line may be coupled to a second memory cell row in a second sub-array among the plurality of sub-arrays. The second sub-array may belong to regions other than the keep-away zone.

In example embodiments, the semiconductor memory device may be a dynamic random access memory (DRAM).

According to example embodiments, a memory device may include a memory cell array, an address register, a row decoder, a column decoder and a control logic. The memory cell array may include a plurality of bank arrays, and each of the plurality of bank arrays may include a plurality of sub-arrays. The control logic may control an access to the memory cell array based on a command and an address signal, and the control logic may dynamically set a keep-away zone. The keep-away zone may include a plurality of memory cell rows which are deactivated based on a first word-line when the first word-line is enabled, and the first word-line may be coupled to a first memory cell row of a first sub-array among the plurality of sub-arrays. The control logic may access the first memory cell row and a second memory cell row by partially overlapping a first row cycle for the first word-line with a second row cycle for a second word-line. The second word-line may be coupled to the second memory cell row of a second sub-array among the plurality of sub-arrays, and the second sub-array may be in an overlappable region other than the keep-away zone.

In example embodiments, the control logic may calculate a first distance from the first word-line based on a row address of the first word-line.

The control logic may set a region including memory cell rows within the first distance from the first word-line as the keep-away zone.

In example embodiments, the control logic may divide the plurality of sub-arrays into a plurality of sub-array groups, and the plurality of sub-array groups may include a first sub-array group.

In example embodiments, a precharge time of the first row cycle may be partially overlapped with a word-line enable time of the second row cycle.

Accordingly, a semiconductor memory device may include a plurality of bank arrays in which a plurality of memory cells are arranged, and a control logic that controls an access to the plurality of bank-arrays. Each of the plurality of bank arrays may include a plurality of sub-arrays. The control logic may control the access to the plurality of bank arrays based on a command and an address signal. The control logic may dynamically set a keep-away zone including a plurality of memory cell rows which are deactivated based on a first word-line, when the first word-line coupled to a first memory cell row of a first sub-array of the plurality of sub-arrays is enabled. Therefore, the semiconductor memory device may compensate for increased timing parameters due to process shrink, and may increase a parallelism efficiency.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
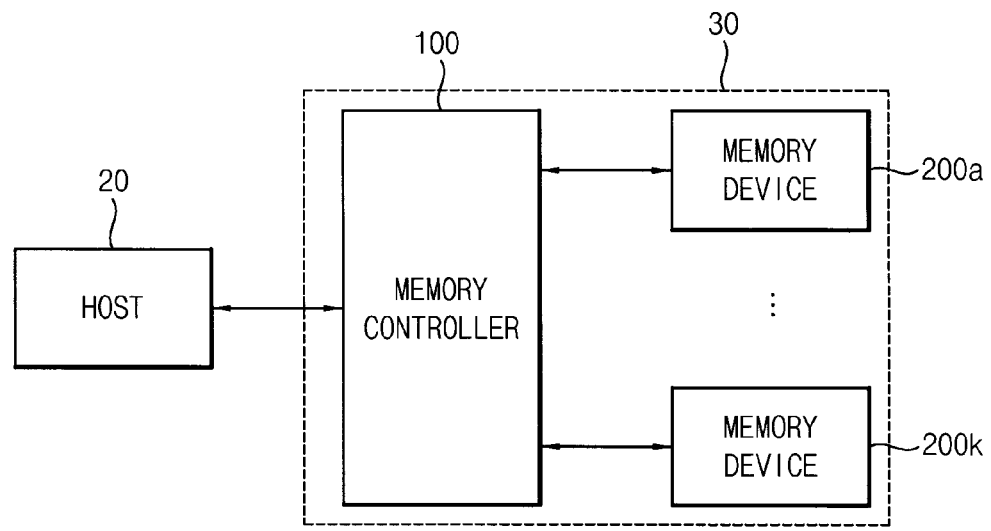
FIG. 1 is a block diagram illustrating an electronic system according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 20 and a memory system 30. The memory system 30 may include a memory controller 100 and a plurality of semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 20.

In addition, the memory controller 100 may issue operation commands to the plurality of semiconductor memory devices 200a~200k for controlling the plurality of semiconductor memory devices 200a~200k.

In some embodiments, each of the plurality of semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. In certain embodiments, each semiconductor device is a chip formed from a wafer or a stack of semiconductor chips in a semiconductor package.

Figure 2:
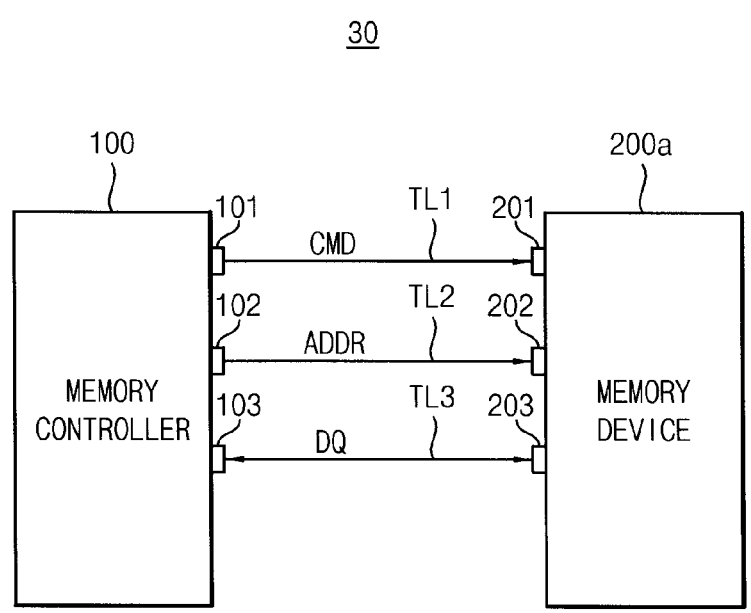
FIG. 2 is a block diagram illustrating an example of the memory system in FIG. 1 according to example embodiments.

FIG. 2 is a block diagram illustrating an example of the memory system in FIG. 1 according to example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding separate pins 104 and 204. For example, each pin may be a conductive terminal at an external surface of the memory controller 100 or semiconductor device 200a for transmitting signals outside of the respective memory controller 100 or semiconductor device 200a. The command pins 101 and 201 may transmit a command signal CMD through a command transmission line TL1, the address pins 102 and 202 may transmit an address signal ADDR through an address transmission line TL2, and the data pins 103 and 203 may exchange data block DTA through a data transmission line TL3.

Referring to FIGS. 1 and 2, the memory controller 100 may input data to the semiconductor memory device 200a or may output data from the semiconductor memory device 200a through the data pins 103 and 203 based on the request from the host 20. In addition, the semiconductor memory device 200a may receive addresses from the memory controller 100 through the address pins 102 and 202.

Figure 3:
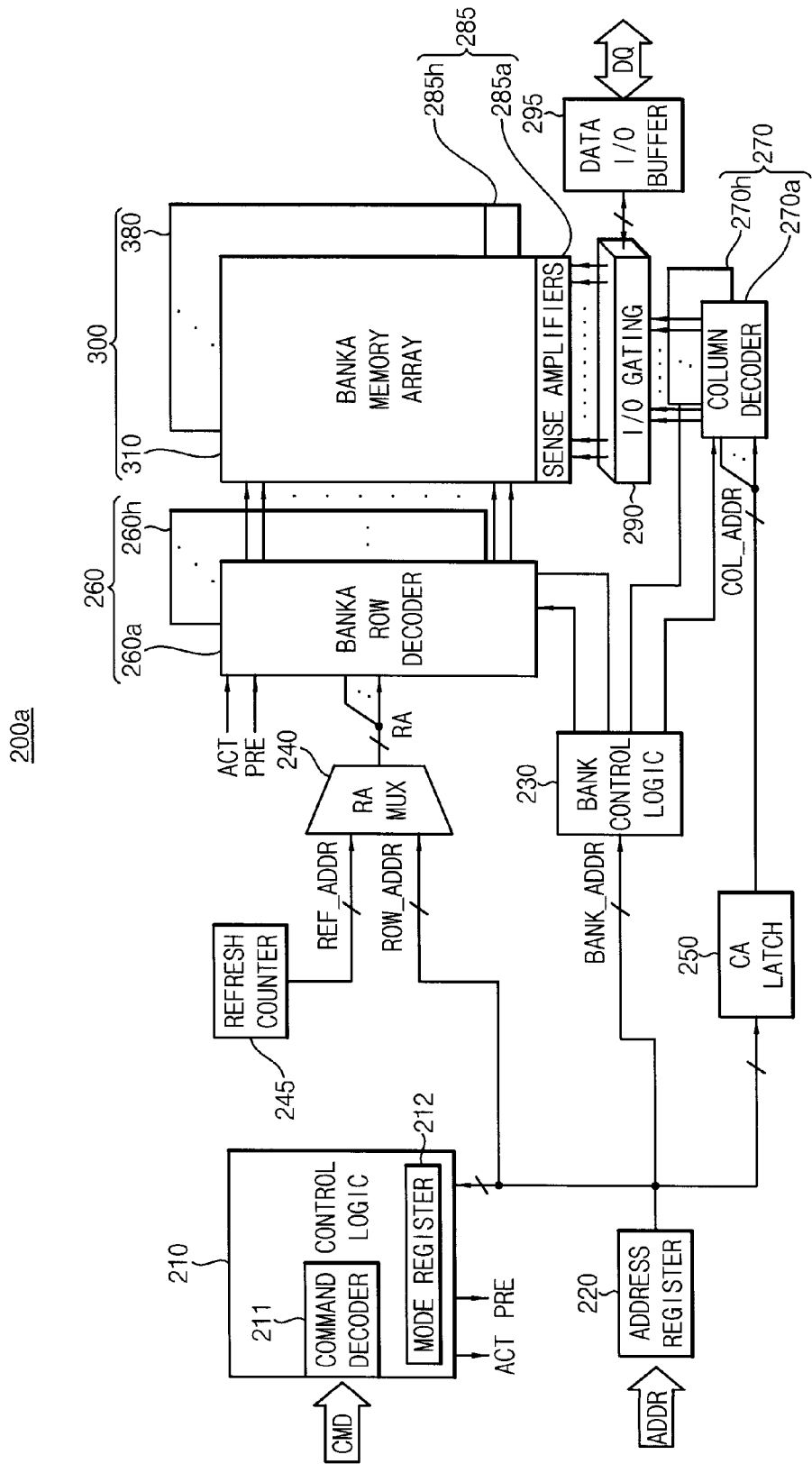
FIG. 3 is a block diagram illustrating an example of the semiconductor memory device in FIG. 2 according to example embodiments.

FIG. 3 is a block diagram illustrating an example of the semiconductor memory device in FIG. 2 according to example embodiments.

Referring to FIG. 3, the semiconductor memory device 200a may include a control logic 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, and a refresh counter 245.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks Although the semiconductor memory device 200a is illustrated in FIG. 3 as including eight banks, the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 in order to output data corresponding to the column address COL_ADDR.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through eighth bank arrays 310~380 may be provided to the data I/O buffer 295 from the memory controller 100. The write driver may write the data DQ in one bank array of the first through eighth bank arrays 310~380.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. In addition, the mode register 212 may set a size of sub-array and a size of activated sub-array according to a mode register set that is based on the address signal from the address register 220 when the control logic 210 controls an access the first through eighth bank arrays 310~380. The control logic 210 may control an access to the memory cell array 300 based on the command CMD and the address signal ADDR, and the control logic 210 may dynamically set a keep-away zone that includes a plurality of memory cell rows which are deactivated based on a first word-line when the first word-line is enabled. The first word-line may be coupled to a first memory cell row of a first sub-array of a plurality of sub-arrays in each of the first through eighth bank arrays 310~380. The control logic 210 may generate an active signal ACT and a precharge signal PRE based on the command CMD and the address signal ADDR, and may provide the row decoder 260 with the active signal ACT and the precharge signal PRE. The row decoder 260 may drive a selected word-line based on the active signal ACT and the precharge signal PRE.

The semiconductor memory device 200a may dynamically set the keep-away zone while the conventional semiconductor memory device sets the keep-away zone according to physical blocks. Therefore, the semiconductor memory device 200a may decrease timing parameters without regard to manufactures of the semiconductor memory device or a generation of the semiconductor memory device by setting the keep-away zone using the memory controller 100.

In the semiconductor memory device 200a, examples of timing parameters include a row cycle time tRC, a /RAS-to-/CAS time tRCD, a write recovery time tWR, a row precharge time tRP, and a row active-to-row active time tRRD.

The row cycle time tRC represents a time between an active command and a next active command. The /RAS-to-/CAS time tRCD represents a time between applying of a /RAS signal and applying of a /CAS signal, for example, a time between a row active command and a column active command. The write recovery time tWR represents a time between enabling of a word-line and writing of data to a memory cell. The row precharge time tRP represents a time between a write recovery time tWR and precharging of a bit line in order to prepare a next active command. The row active-to-row active time tRRD represents a time between a row active command and a row active command, such as, for example, a row active-to-row active time between different banks.

Figure 4:
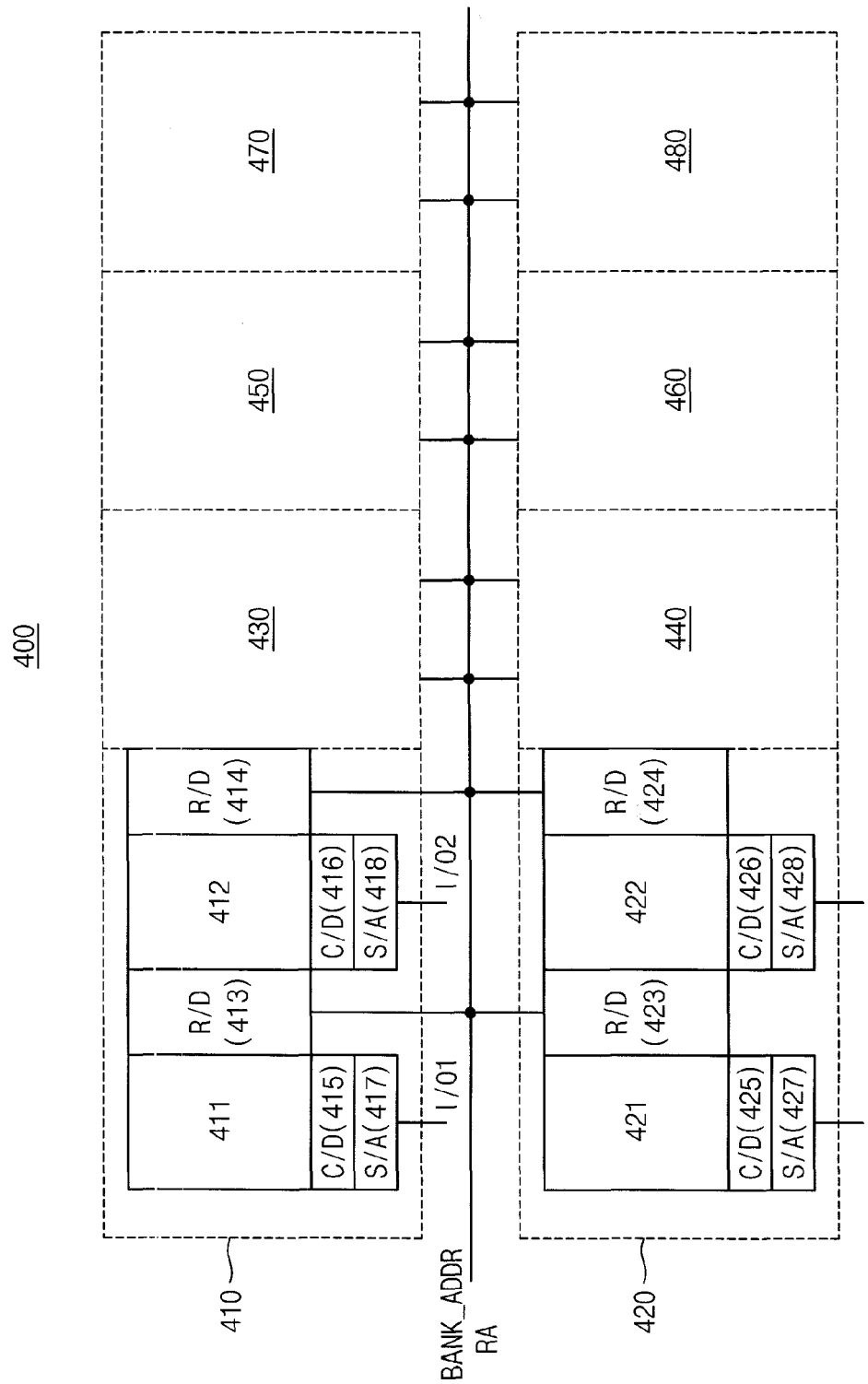
FIG. 4 is a block diagram illustrating an example of the semiconductor memory device of FIG. 3 according to example embodiments.

FIG. 4 is a block diagram illustrating an example of the semiconductor memory device of FIG. 3 according to example embodiments.

Figure 5:
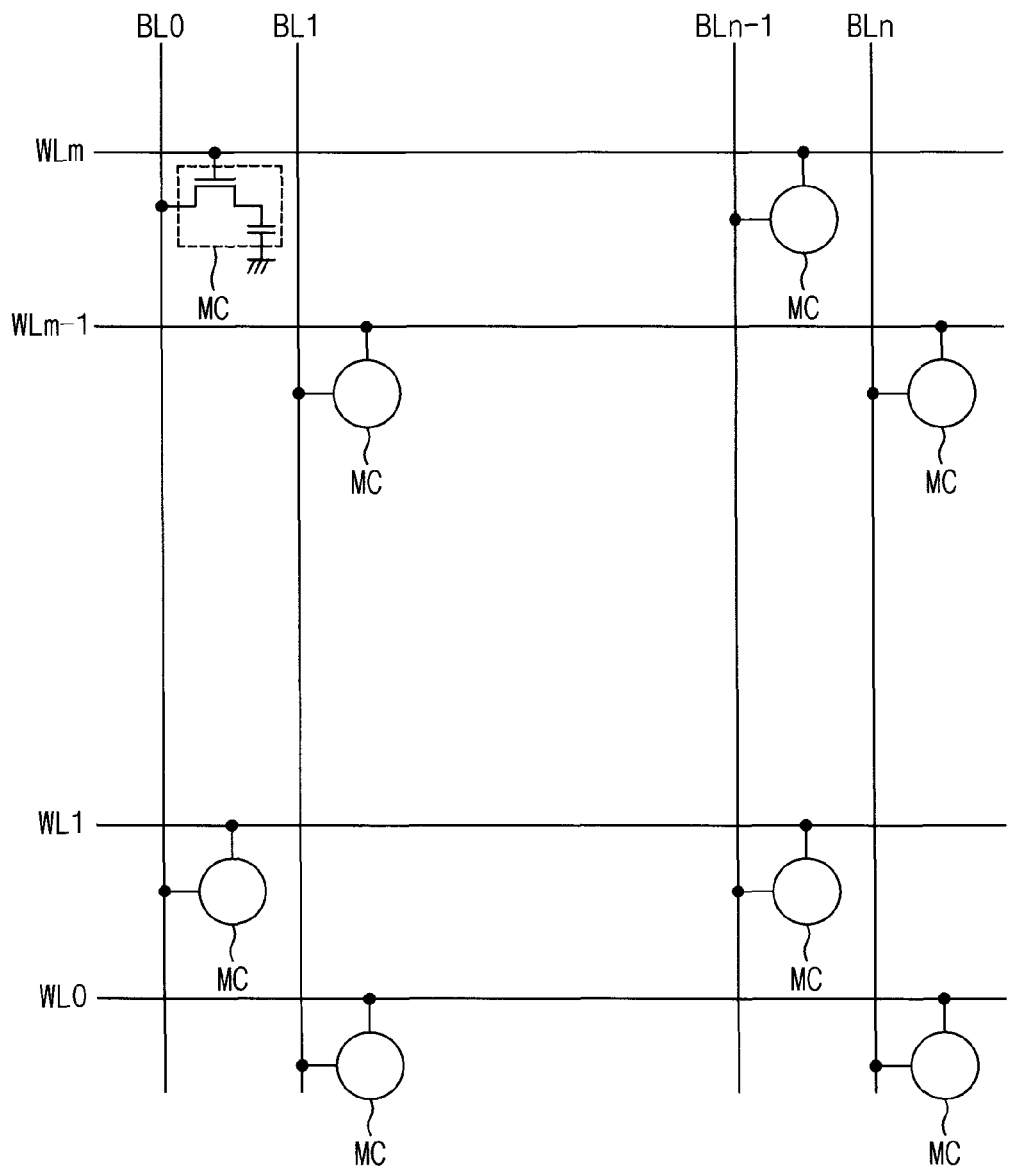
FIG. 5 is a circuit diagram illustrating one of banks arrays in FIG. 3 according to example embodiments.

Referring to FIG. 4, a semiconductor memory device 400 may include a plurality of banks 410~480 in which a plurality of memory cells are arranged in columns and rows. Each of the plurality of banks 410~480 may include a plurality of word-lines WLs, a plurality of bit-lines BLs, and a plurality of memory cells MCs disposed near intersections between the word-lines WLs and the bit-lines BLs, as shown in FIG. 5. In one embodiment, each of the plurality of memory cells MCs may include a dynamic random access memory (DRAM) cell structure. The plurality of word-lines WLs to which the plurality of memory cells MCs are connected may be defined as rows of the plurality of banks 410~480, and the plurality of bit-lines BLs to which the plurality of memory cells MCs are connected may be defined as columns of each of the plurality of banks 410~480.

The semiconductor memory device 400 may include eight banks 410~480 in FIG. 4. However, the present disclosure is not limited thereto, and the number of banks included in the semiconductor memory device 400 may be any positive integer.

The first bank 410 of the plurality of banks 410~480 may include a first sub-bank 411, a second sub-bank 412, a first row decoder 413, a second row decoder 414, a first column decoder 415, and a second column decoder 416. In addition, the second bank 420 may include a first sub-bank 421, a second sub-bank 422, a first row decoder 423, a second row decoder 424, a first column decoder 425, and a second column decoder 426. Each configuration of third through eighth 430~480 may be substantially same as each configuration of the first bank 410 and the second bank 420. The first row decoder 413 and the second row decoder 414 may receive the bank address BANK_ADDR and the row address RA. The first column decoder 415 and the second column decoder 416 may receive the column addresses. One of the plurality of banks 410~480 may be selected in response to the bank address BANK_ADDR, and memory cells in the selected bank may be accessed in response to the row address RA and the column address.

The first bank 410 may be divided into a first sub-bank 411 and a second sub-bank 412. The first sub-bank 411 and the second sub-bank 412 may be arranged in a direction, for example, a row direction, in which the plurality of word-lines WLs of the plurality of memory cells MCs are arranged. The first sub-bank 111 may be connected to the first row decoder 413 and the first column decoder 415. Memory cells of the first sub-bank 411 may be addressed by the first row decoder 413 and the first column decoder 415. The second sub-bank 412 may be connected to the second row decoder 414 and the second column decoder 416. Memory cells of the second sub-bank 412 may be addressed by the second row decoder 414 and the second column decoder 416.

The first sub-bank 411 or the second sub-bank 412 may be selected by any one bit from among the row address signals RA applied to the first row decoder 413 and the second row decoder 414. For example, the first sub-bank 411 or the second sub-bank 412 may be selected by a most significant bit (MSB).

The first sub-bank 411 and the second sub-bank 412 are respectively connected to first and second data line sense amplifier blocks 417 and 418, and are also respectively connected to first and second data input/output lines I/O1 and I/O2 which are independent from each other. Data that is read from the first sub-bank 411 may be output through the first data line sense amplifier block 417 and the first data input/output lines I/O1. Data that is read from the second sub-bank 412 may be output through the second data line sense amplifier 418 and the second data input/output lines I/O2.

Figure 6:
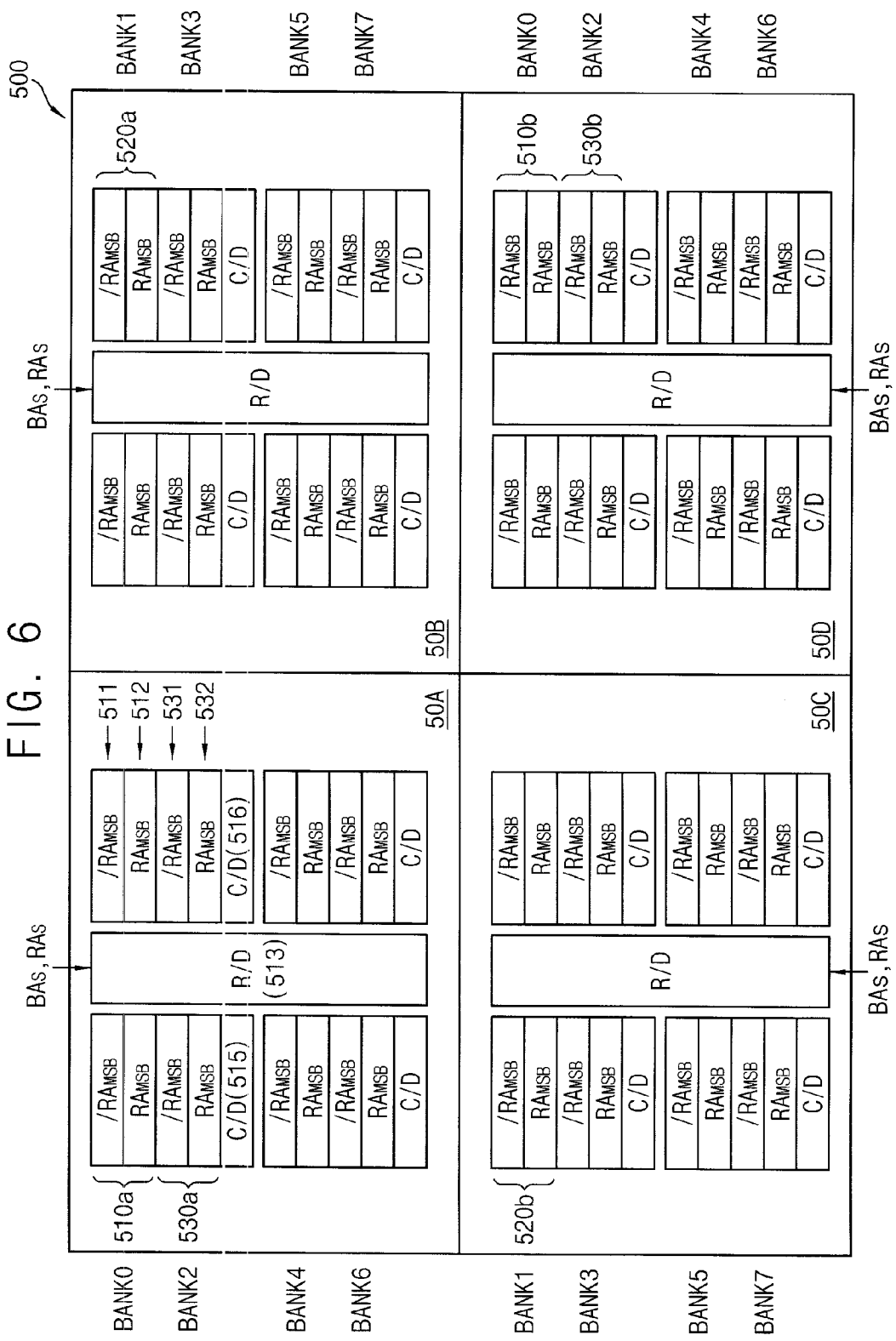
FIG. 6 is a block diagram illustrating an example of the semiconductor memory device of FIG. 3 according to example embodiments.

FIG. 6 is a block diagram illustrating an example of the semiconductor memory device of FIG. 3 according to example embodiments.

Referring to FIG. 6, a semiconductor memory device 500 may include a plurality of banks, such as first through eighth banks BANK0 through BANK7. Each of the plurality of banks have a stack bank architecture. The first through eighth banks BANK0 through BANK7 may be separated for noise distribution. The first through eighth banks BANK0 through BANK7 may be separately disposed on four equal surfaces, namely, first, second, third, and fourth quarter surfaces 50A, 50B, 50C, and 50D relative to pads which are arranged at a center of the semiconductor memory device 500. Each of the plurality of banks BANK0 through BANK7 may include a plurality of word-lines WLs, a plurality of bit-lines BLs, and a plurality of memory cells MCs disposed near intersections between the plurality of word-lines WLs and the plurality of bit-lines BLs, as shown in FIG. 5.

The first bank BANK0 may be disposed on the first quarter surface 50A and the fourth quarter surface 50D, and the second bank BANK1 may be disposed on the second quarter surface 50B and the third quarter surface 50C. The even banks BANK2, BANK4, and BANK6 may be disposed on the first quarter surface 50A and the fourth quarter surface 50D. The odd banks BANK3, BANK5, and BANK7 may be disposed on the second quarter surface 50B and the third quarter surface 50C.

The first bank BANK0 may include a first memory cell array block 510*a* disposed on the first quarter surface 50A and a memory cell array block 510*b* disposed on the fourth quarter surface 50D. The second bank BANK1 may include a first memory cell array block 520*a* disposed on the second quarter surface 50B and a memory cell array block 520*b* disposed on the third quarter surface 50C. The third bank BANK2 may include a first memory cell array block 530*a* disposed on the first quarter surface 50A and a memory cell array block 530*b* disposed on the fourth quarter surface 50D.

Each of the even banks BANK4 and BANK6 may include a first memory cell array block disposed on the first quarter surface 50A and a second memory cell array block disposed on the fourth quarter surface 50D. Each of the odd banks BANK3, BANK5, and BANK7 may include a first memory cell array block disposed on the second quarter surface 50B and a second memory cell array block disposed on the third quarter surface 50C.

The first quarter surface 50A of the memory device 500 may have a stack bank structure in which the first memory cell array block 510*a* of the first bank BANK0 and the first memory cell array block 530*a* of the third bank BANK2 are stacked. The first memory cell array block 510*a* of the first bank BANK0 may be divided into two sub-array groups 511 and 512. The first memory cell array block 530*a* of the third bank BANK2 may be divided into two sub-array groups 531 and 532. The sub-array groups 511 and 512 of the first bank BANK0 and the sub-array groups 531 and 532 of the third bank BANK2 may be arranged in a direction, for example, a column direction, in which bit lines of memory cells are arranged.

The first memory cell array blocks 510a and 530a of the first and third banks BANK0 and BANK2 may be separated from each other relative to a row decoder 513. The first memory cell array blocks 510a and 530a may be connected to the row decoder 513 and first and second column decoders 515 and 516. Memory cells of the first memory cell array blocks 510a and 530a may be addressed by the row decoder 513 and the first and second column decoders 515 and 516.

The row decoder 513 may receive bank address signals BAs and row address signals RAs. The first and second column decoders 515 and 516 may receive column address signals (not shown). One of the first and third banks BANK0 and BANK2 may be selected according to the bank address signals BAs, and memory cells of the sub-array groups 511, 512, 531, and 532 in the selected bank may be addressed according to the row address signals RAs and the column address signals.

The first sub-array group 511 or the second sub-array group 512 of the first bank BANK0 may be selected by any one bit of the row address signals RAs applied to the row decoder 513. For example, the first sub-array group 511 or the second sub-array group 512 may be selected by an MSB signal $RA_{MSB}$ of the row address signals RAs. The first sub-array group 511 may be selected by a $/RA_{MSB}$ signal, and the second sub-array group 512 may be selected by a $RA_{MSB}$ signal.

Like in the first and third banks BANK0 and BANK2, first memory cell array blocks, each of which is divided into two sub-array groups, may be stacked in the fifth and seventh banks BANK4 and BANK6. One of the sub-array groups in the fifth and seventh banks BANK4 and BANK6 may be selected by an MSB signal $RA_{MSB}$ of row address signals applied to the row decoder 513.

In the first through eighth banks BANK0 through BANK7 disposed on the other quarter surfaces, namely, the second, third, and fourth quarter surfaces 50B, 50C, and 50D, first memory cell array blocks, each of which is divided into two sub-array groups, may be stacked. One of the sub-array groups in the first through eighth banks BANK0 through BANK7 may be selected by an MSB signal $RA_{MSB}$ of row address signals applied to a row decoder disposed on a corresponding one of the quarter surfaces, namely, the second, third, and fourth quarter surfaces 50B, 50C, and 50D.

Figure 7:
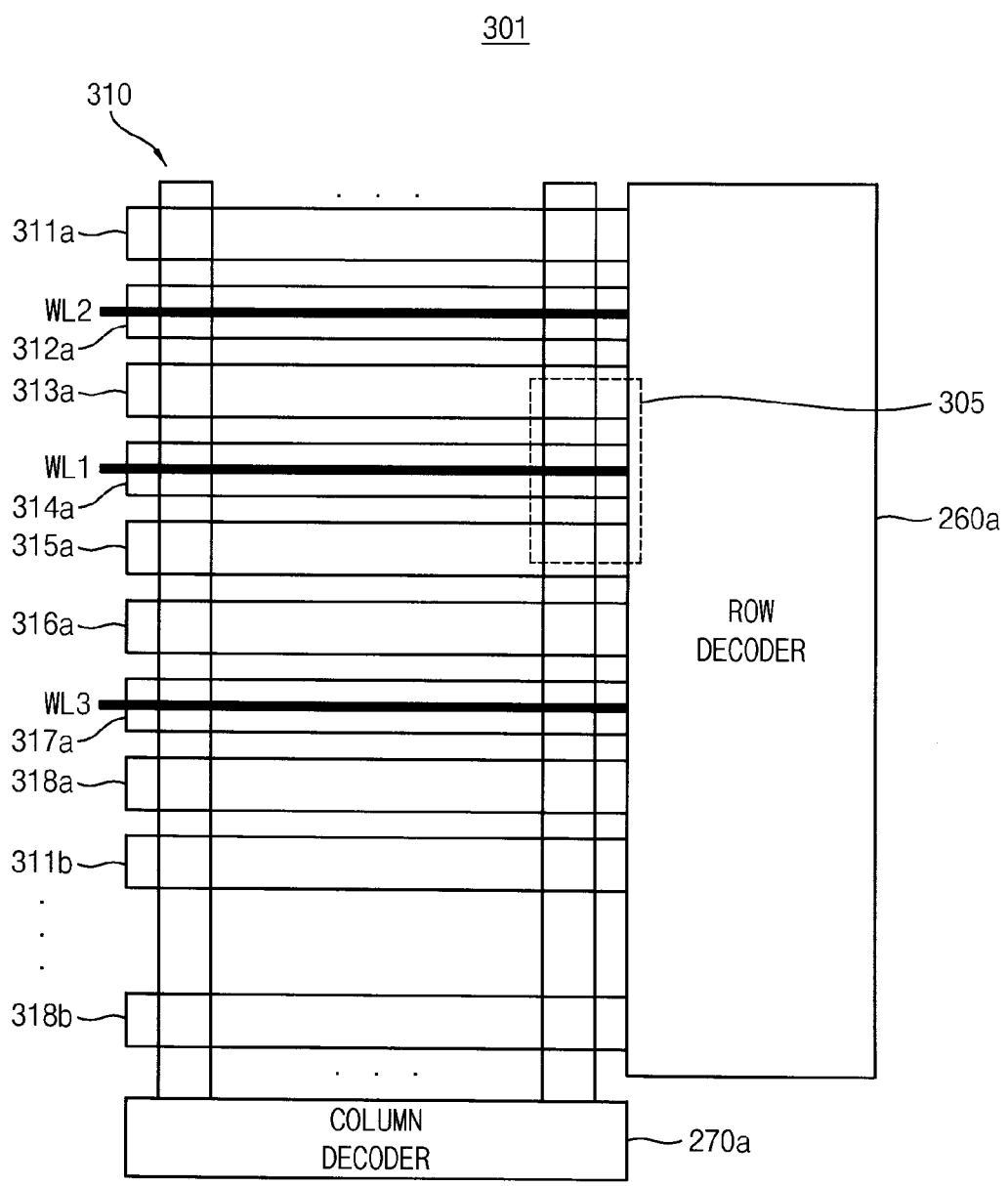
FIG. 7 is a diagram explaining an example architecture of the first bank in the semiconductor memory device of FIG. 3.

FIG. 7 is a diagram explaining an example architecture of the first bank in the semiconductor memory device of FIG. 3.

Figure 8:
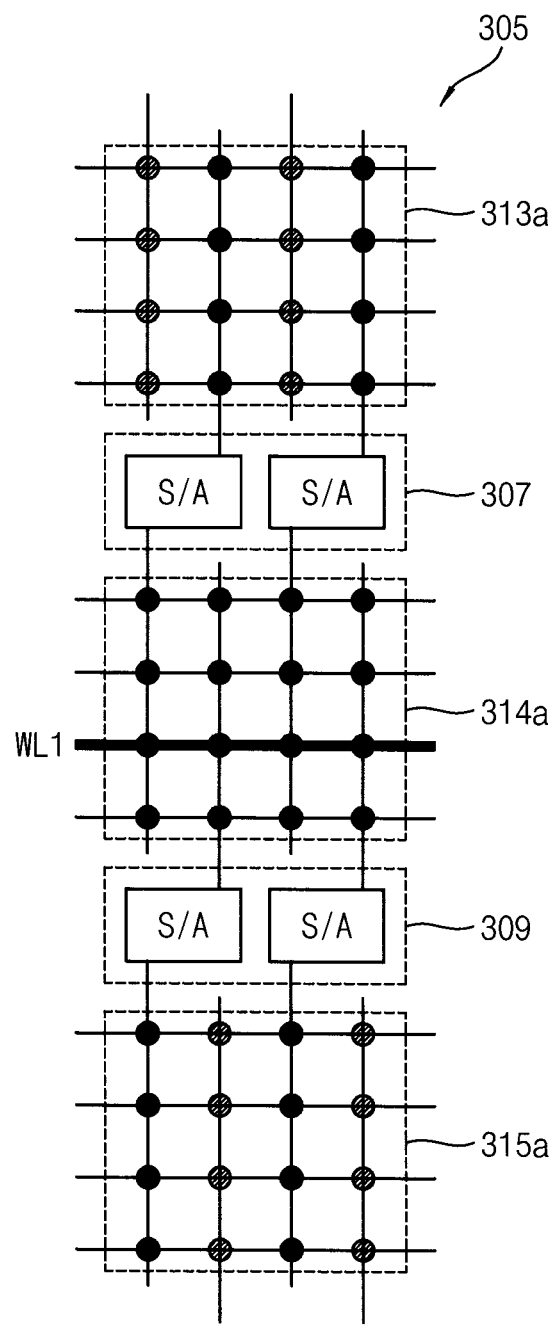
FIG. 8 illustrates adjacent sub-arrays in FIG. 7.

FIG. 8 illustrates adjacent sub-arrays 305 in FIG. 7.

Referring to FIGS. 3, 7 and 8, a first bank 301 may include the first bank array 310, the row decoder 260a and the column decoder 270a.

The first bank array 310 may include a plurality of sub-arrays (or memory blocks) 311a~318a and 311b~318b. Each of the plurality of sub-arrays 311a~318a and 311b~318b may include at least two memory cell rows (i.e., at least two word-lines). The sub-arrays 311a~318a may be designed to share data input/out lines and a data line sense amplifier block. The sub-arrays 311b~318b may be designed to share data input/out lines and a data line sense amplifier block.

The sub-array 314a may be connected to bit line sense amplifier blocks 307 and 309 that are disposed over and under the sub-array 314a. The bit line sense amplifier block 307 may be connected to the sub-array 313a. The bit line sense amplifier block 307 may be shared by the sub-arrays 313a and 314a. The bit line sense amplifier block 309 may be connected to the sub-array 315a. The bit line sense amplifier block 309 may be shared by the sub-arrays 314a and 315a.

In the sub-array 314a, when one word-line (or a first word-line) WL1 is enabled, data of memory cells connected to the word-line WL1 may be transmitted to the bit line sense amplifier blocks 307 and 309, and may be sensed and amplified. In this case, the sub-array 313a connected to the bit line sense amplifier block 307 and the sub-array 315a connected to the bit line sense amplifier block 309 should be deactivated. For example, the sub-arrays 313a and 315a adjacent to the activated sub-array 314a may be deactivated. The deactivated sub-arrays 313a and 315a may be referred to as a keep-away zone.

A sub-array outside the keep-away zone of the activated sub-array 314a, for example, the sub-array 312a (for example, s second word-line WL2) may be activated. When the sub-array 312a is activated, since the sub-arrays 311a and 313a adjacent to the sub-array 312a belong to the keep-away zone, the sub-arrays 311a and 313a may be deactivated.

When the first word-line WL1 in a first sub-array is activated, sub-arrays of the memory cells sharing the bit-line sense amplifier block with the memory cells coupled to the first word-line WL may be deactivated as the keep-away zone. The conventional semiconductor memory device sets the keep-away zone based on physical memory blocks. Since each size of the memory blocks may be different according to the manufacturer of the semiconductor memory device or a process generation of the semiconductor memory device, the keep-away zone must be set whenever the manufacturer of the semiconductor memory device or the process generation of the semiconductor memory device is changed. However, the semiconductor memory device 200a may dynamically set the keep-away zone based on an activated word-line without regard to the manufacture or the process generation.

Figure 9:
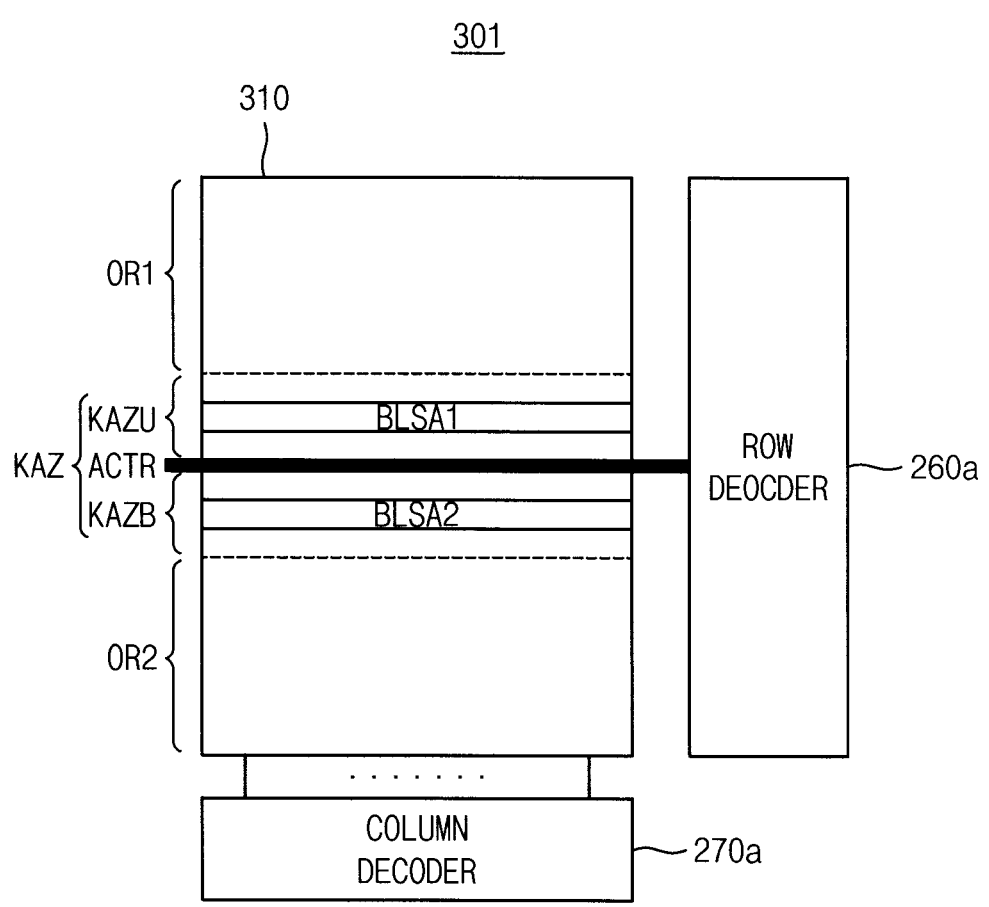
FIG. 9 is an example illustrating that the keep-away zone is dynamically set in the semiconductor memory device of FIG. 3.

FIG. 9 is an example illustrating that the keep-away zone is dynamically set in the semiconductor memory device of FIG. 3.

Referring to FIG. 9, the control logic 210 in FIG. 3 may calculate regular distances KAZU and KAZB from an activated word-line ACTR based on a row address of the activated word-line ACTR, and may set a region including memory cell rows within the regular distances KAZU and KAZB from the activated word-line ACTR as the keep-away zone KAZ. Regions outside the keep-away zone KAZ may be overlappable regions OR1 and OR2. Memory cell rows in the keep-away zone KAZ must be deactivated, and memory cell rows in the overlappable regions OR1 and OR2 may be activated. When the activated word-line ACTR is a first word-line coupled to a first memory cell row in the first sub-array, the control logic 210 may access the first memory cell row and second memory cell row by partially overlapping a first row cycle with respect to the first word-line with a second row cycle with respect to a second word-line based on the command CMD and the address signal AADR. The second word-line may be coupled to the second memory cell row included in a second sub-array in the overlappable regions OR1 and OR2. For example, the control logic 210 may calculate the regular distance KAZU and KAZB including 2K word-lines based on the row address of the activated word-line ACTR. Memory cells within the regular distance KAZU may share a bit-line sense amplifier BLSA1 with the first memory cell row coupled to the activated word-line ACTR. Memory cells within the regular distance KAZB may share a bit-line sense amplifier BLSA2 with the first memory cell row coupled to the activated word-line ACTR.

Figure 10:
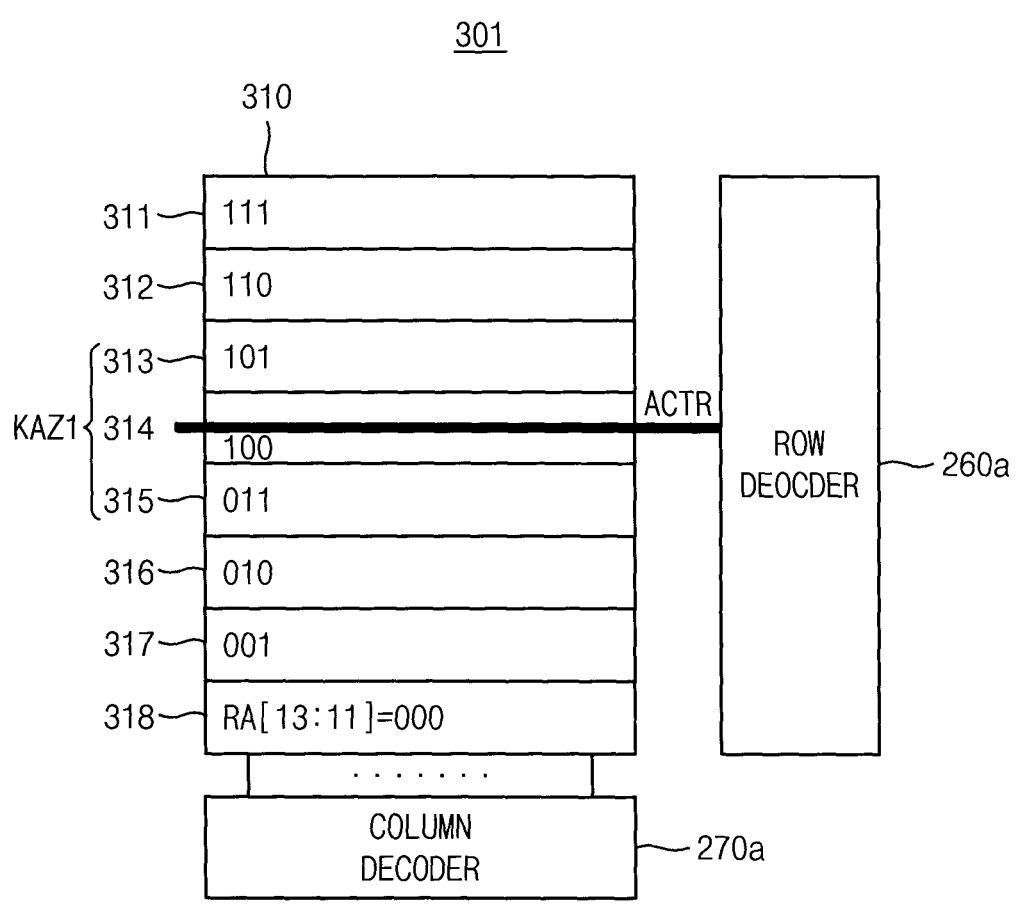
FIG. 10 is another example illustrating that the keep-away zone is dynamically set in the semiconductor memory device of FIG. 3.

FIG. 10 is another example illustrating that the keep-away zone is dynamically set in the semiconductor memory device of FIG. 3.

Referring to FIG. 10, the control logic 210 may divide the sub-arrays included in the bank array 310 into a plurality of sub-array groups 311~318 based on at least some of the address signal ADDR from the address register 220, and may set the sub-array group 314 including the activated word-line ACTR and the sub-array groups 313 and 315 adjacent to the sub-array group 314 as a keep-away zone KAZ1. Each of the plurality of sub-array groups 311~318 may include at least one sub-array. The control logic 210 may set the sub-array group 314 including the activated word-line ACTR as an activated sub-array group (refer to ACTRG in FIG. 11).

When a row address RA designating the activated word-line ACTR corresponds to '10011011011110', the control logic 210 may divide the sub-arrays in the bank array 310 into the plurality of sub-array groups 311~318 based on upper three bits of the row address RA. A memory cell row coupled to the activated word-line ACTR may belong to the sub-array group 314. The control logic 210 may activate the sub-array groups 311, 312, 316 and 318 outside the keep-away-zone KAZ1.

Figure 11:
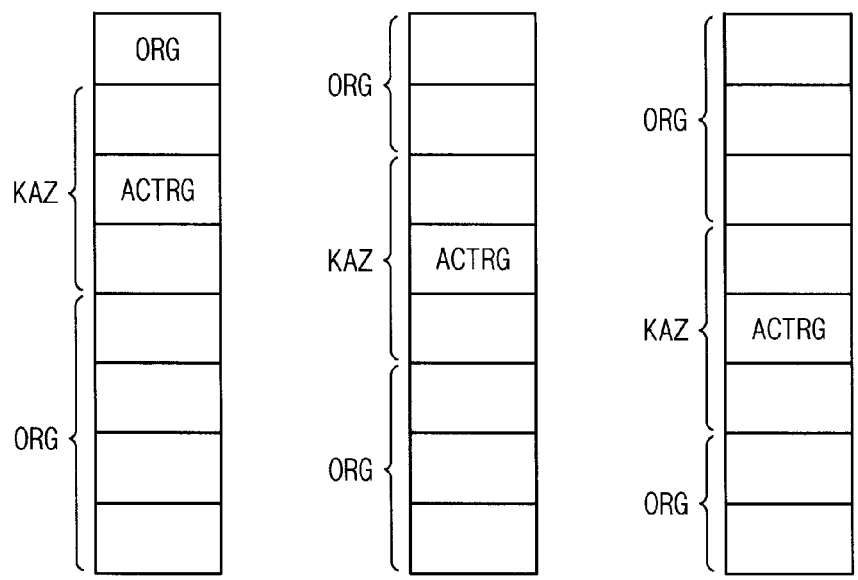
FIG. 11 illustrates that the keep-away zone moves when the keep-away zone is dynamically set in FIG. 10.

FIG. 11 illustrates that the keep-away zone moves when the keep-away zone is dynamically set in FIG. 10.

Referring to FIG. 11, an activated sub-array group ACYRG may be determined according to the activated word-line, the control logic 210 may set the activated sub-array group ACTRG and sub-array groups adjacent to the activated sub-array group ACTRG as the keep-away zone KAZ. Overlappable regions ORG may be dynamically determined.

Figure 12:
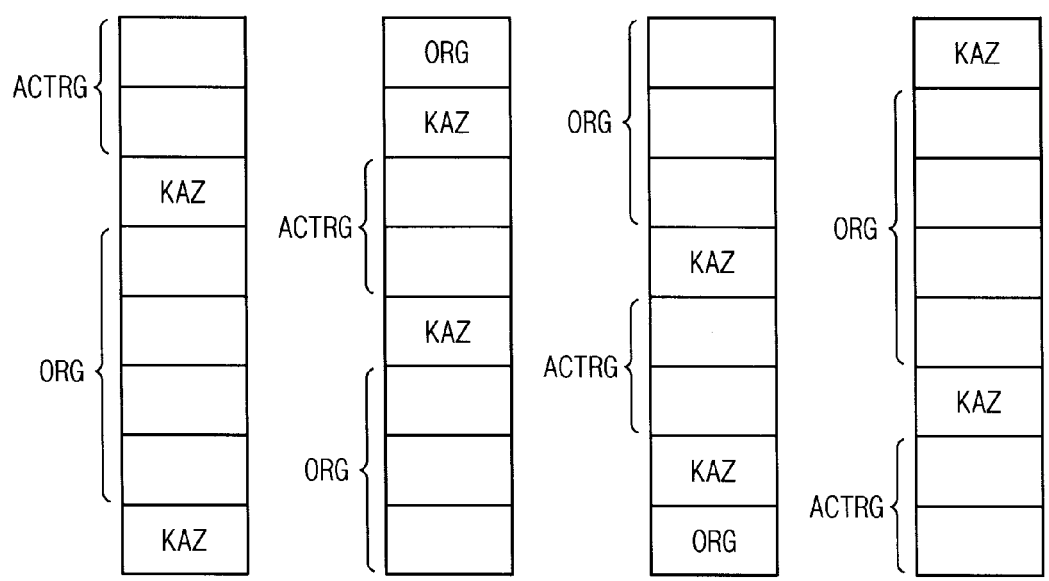
FIG. 12 is still another example illustrating that the keep-away zone is dynamically set in the semiconductor memory device of FIG. 3.

FIG. 12 is still another example illustrating that the keep-away zone is dynamically set in the semiconductor memory device of FIG. 3.

In FIG. 12, the activated sub-array group ACTRG may be determined with a boundary when the control logic 210 divides the sub-arrays in the bank array 310 into the plurality of sub-array groups 311~318 based on upper three bits of the row address RA as in FIG. 10. In FIG. 12, two adjacent sub-array groups may be set as one activated sub-array group ACTRG, and the keep-away zone KAZ and the overlappable regions ORG may be set according to the activated sub-array group ACTRG.

Figure 13:
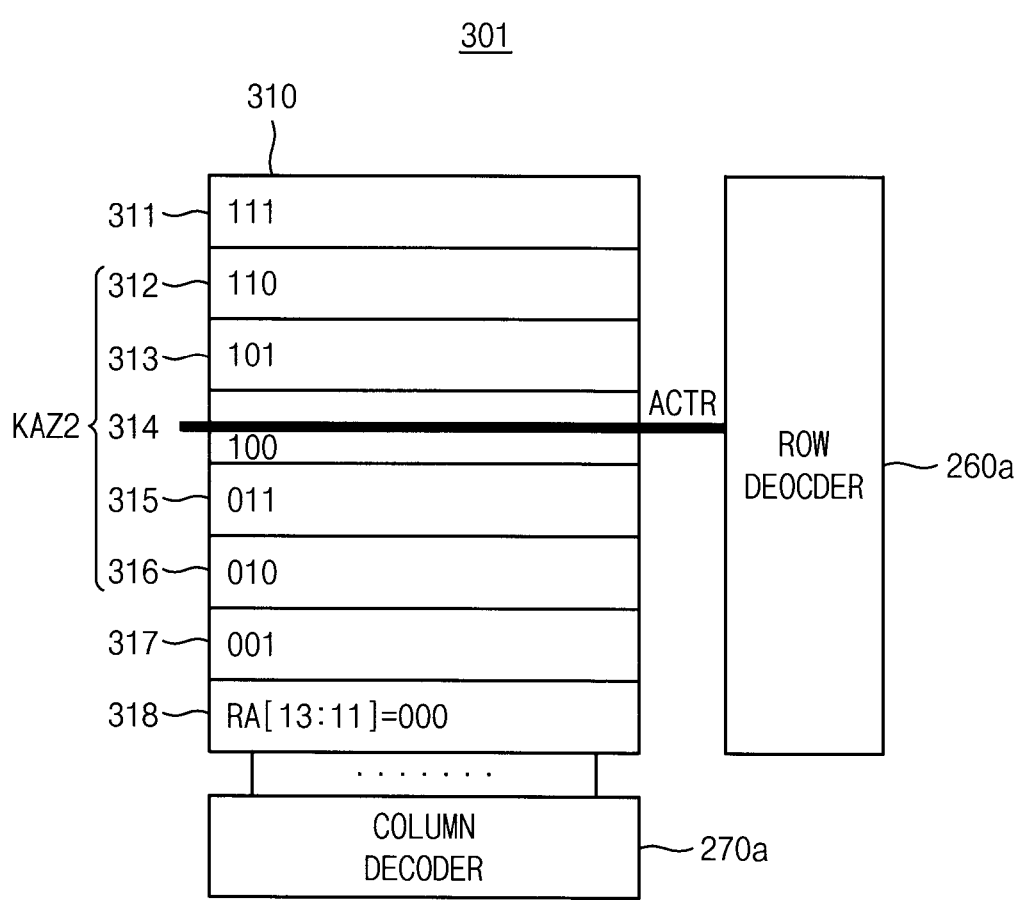
FIG. 13 is still another example illustrating that the keep-away zone is dynamically set in the semiconductor memory device of FIG. 3.

FIG. 13 is still another example illustrating that the keep-away zone is dynamically set in the semiconductor memory device of FIG. 3.

Referring to FIG. 13, a keep-away zone KAZ2 may include the sub-array groups 313 and 315 adjacent to the activated sub-array group 314, and the sub-array groups 312 and 316 adjacent to the sub-array groups 313 and 315. The mode register 212 may set a number of the sub-array groups in the keep-away zone based on the address signal ADDR. For example, the number of the sub-array groups in the keep-away zone may be varied by the mode register set. Also, a size of the activated sub-array group and a size of keep-away sub-array group adjacent to the activated sub-array group may be varied by the mode register set.

Figure 14:
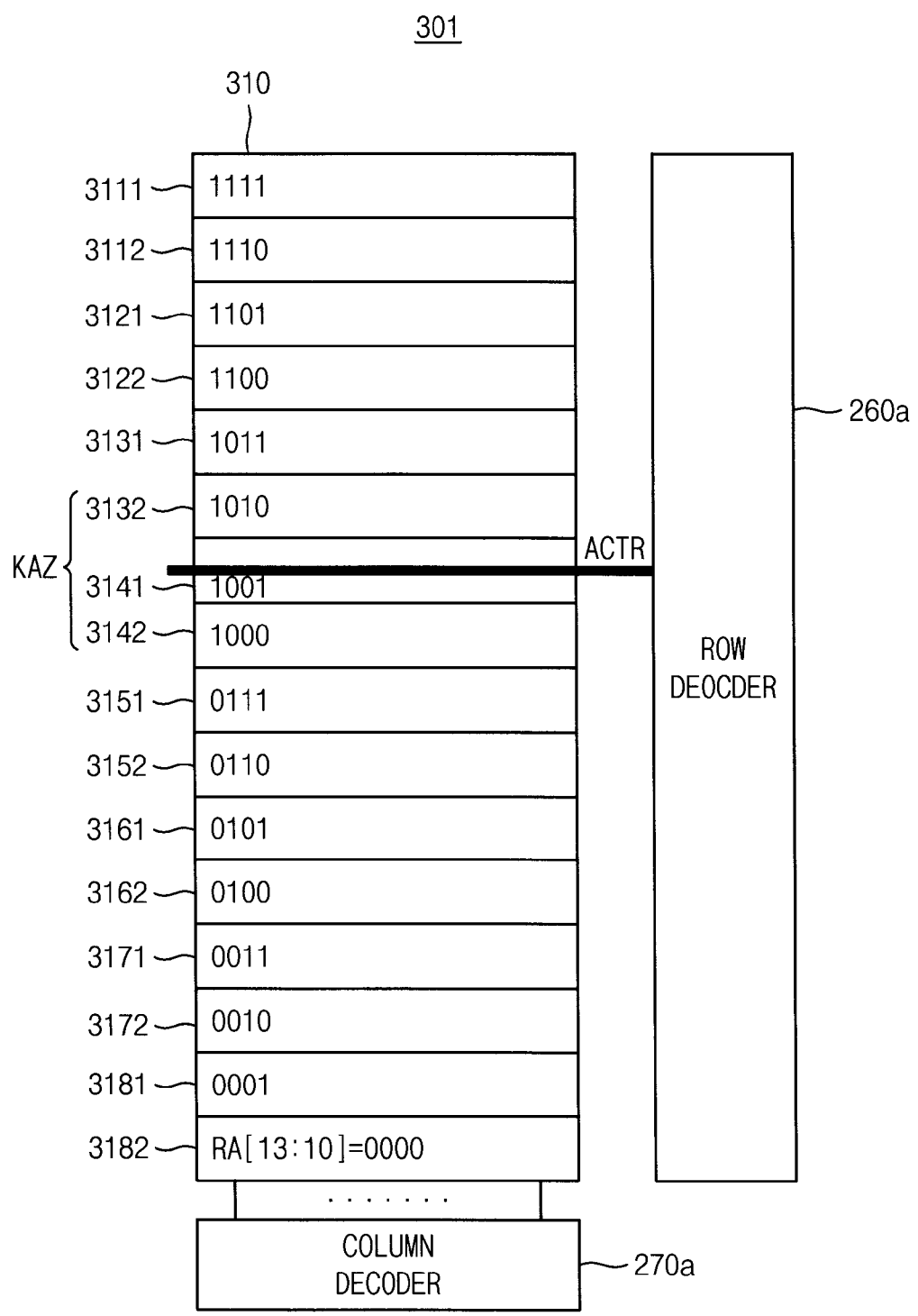
FIG. 14 is still another example illustrating that the keep-away zone is dynamically set in the semiconductor memory device of FIG. 3.

FIG. 14 is still another example illustrating that the keep-away zone is dynamically set in the semiconductor memory device of FIG. 3.

Referring to FIG. 14, the control logic 210 may divide the sub-arrays included in the bank array 310 into a plurality of sub-array groups 3111~3182 based on at least some of the address signal ADDR from the address register 220, and may set the sub-array group 3141 including the activated word-line ACTR and the sub-array groups 3132 and 3142 adjacent to the sub-array group 3141 as a keep-away zone KAZ. Each of the plurality of sub-array groups 3111~3182 may include at least two sub-arrays.

When a row address RA designating the activated word-line ACTR corresponds to '10011011011110', the control logic 210 may divide the sub-arrays in the bank array 310 into the plurality of sub-array groups 3111~3182 based on upper four bits of the row address RA. A memory cell row coupled to the activated word-line ACTR may belong to the sub-array group 3414. The mode register 212 may set a size of the sub-array group based on the address signal ADDR. For example, the size of the sub-array group may be varied by the mode register set.

Figure 15:
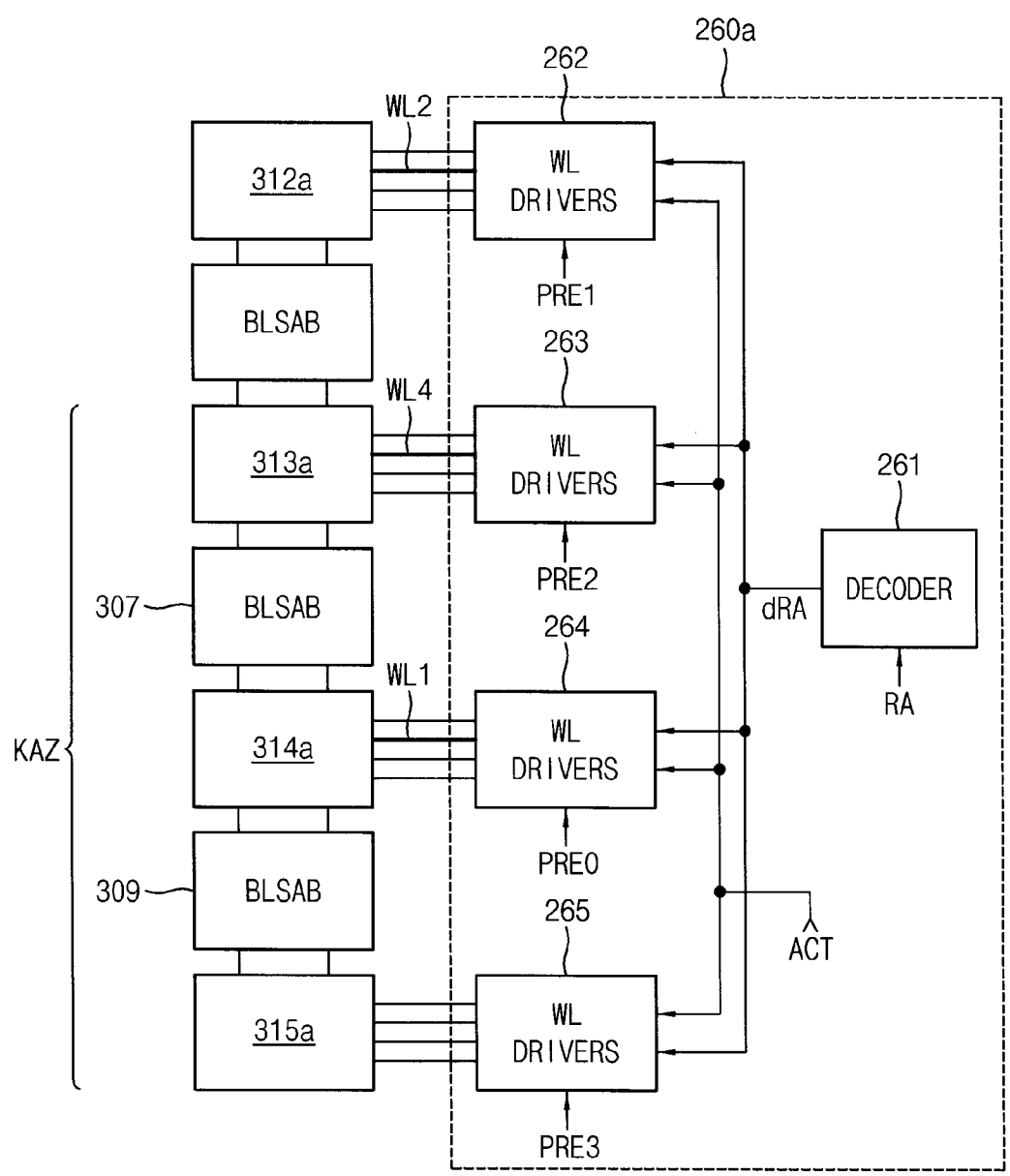
FIG. 15 is a block diagram illustrating the row decoder in the first bank of FIG. 7, according to example embodiments.

FIG. 15 is a block diagram illustrating the row decoder in the first bank of FIG. 7, according to example embodiments.

Referring to FIG. 15, the row decoder 260a may include a decoder 261 and a plurality of word-line drivers 262, 263, 264 and 265. Each of the plurality of word-line drivers 262, 263, 264 and 265 may be coupled to each of the sub-arrays 312a, 313a, 314a and 315a. The decoder 261 may decode the row address RA to commonly apply a decoded row address dRA to the plurality of word-line drivers 262, 263, 264 and 265. The control logic 210 in FIG. 3 may commonly apply the active signal ACT to the plurality of word-line drivers 262, 263, 264 and 265 based on the command CMD and the address signal ADDR. In addition, the control logic 210 may apply the precharge signals PRE1, PRE2, PRE3 and PER4, which reset the plurality of word-line drivers 262, 263, 264 and 265, to the plurality of word-line drivers 262, 263, 264 and 265 individually.

Figure 16:
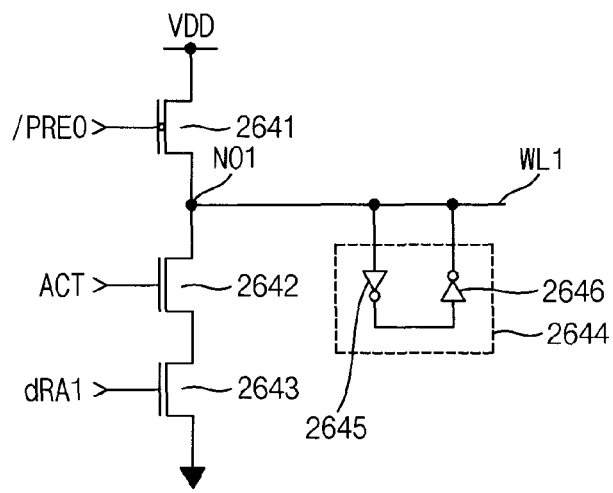
FIG. 16 illustrates one of the word-line drivers in FIG. 15 according to example embodiments.

FIG. 16 illustrates one of the word-line drivers in FIG. 15 according to example embodiments.

Referring to FIG. 16, the word-line driver 264 may include a p-channel metal oxide semiconductor (PMOS) transistor 2641, n-channel metal oxide semiconductor (NMOS) transistors 2642 and 2653, and a latch 2644. The PMOS transistor 2641 may be coupled between a power supply voltage VDD and a first node NO1 coupled to a corresponding word-line WL1. The NMOS transistors 2642 and 2643 may be connected in series between the first node NO1 and a ground voltage. The latch 2644 may be connected to the word-line WL1. The latch 2644 may include inverters 2645 and 2646 which are back-to-back coupled.

The PMOS transistor 2641 may have a gate that receives an inverted version /PRE0 of the precharge signal PRE0, the NMOS transistor 2642 may have a gate that receives the active signal ACT, and the NMOS transistor 2643 may have a gate that receives a decoded row address dRA1. The active signal ACT and the decoded row address dRA1 may not be level-type but pulse-type. The active signal ACT and the decoded row address dRA1 may be commonly applied to the word-line drivers 262, 263, 264 and 265 in FIG. 15. The latch 2644 may latch the active signal ACT until the precharge signal PRE0 is applied.

Figure 17:
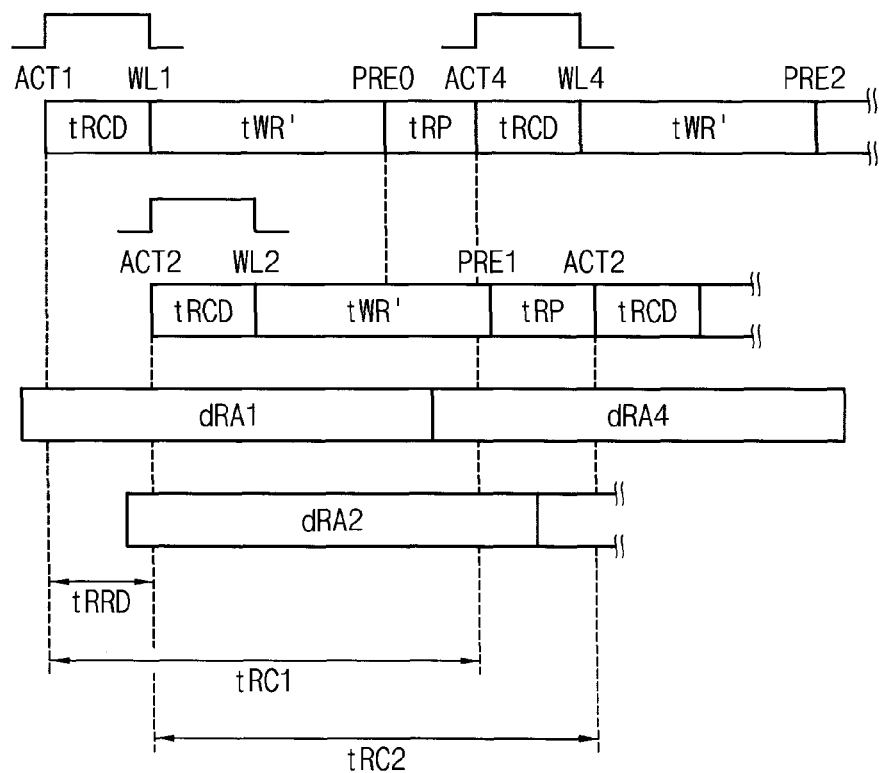
FIG. 17 is a timing diagram explaining operation of the semiconductor memory device of FIG. 3.

FIG. 17 is a timing diagram explaining an operation of the semiconductor memory device of FIG. 3.

Referring to FIGS. 3 through 17, an active signal ACTT for the sub-array 314a may be applied, a /RAS-to-/CAS time tRCD may elapse, and a first word-line WL1 may be enabled. The first word-line WL1 may be coupled to selected memory cells in the sub-array 314a. A data write operation to the selected memory cells connected to the first word-line WL1 may be performed. A memory cell data write operation of the sub-array 314a may be performed for a write recovery time tWR'. After the write recovery time tWR' elapses, bit lines of the memory cells in the sub-array 314a may be precharged due to a precharge signal PRE0. A bit line precharge operation of the sub-array 314a may be performed for a row precharge time tRP. An active signal ACT4 for the sub-array 313a belonging to the keep-away zone may be applied, a fourth word-line WL4 may be enabled, a data write operation to the selected memory cells connected to the fourth word-line WL4 may be performed, and bit lines of the memory cells in the sub-array 314a may be precharged due to a precharge signal PRE2. The decoded row address dRA1 with a pulse-type for the first word-line WL1 may be applied from a time before the active signal ACT1 is applied to a time after the precharge signal PRE0 is applied. A decoded row address dRA4 with a pulse-type for the fourth word-line WL4 may be applied from a time before the active signal ACT4 is applied to a time after the precharge signal PRE2 is applied.

An active signal ACT2 for the sub-array 312a in the overlapping region may be applied, a /RAS-to-/CAS time tRCD may elapse, and a second word-line WL2 may be enabled. The second word-line WL2 may be coupled to selected memory cells in the sub-array 312a in the overlapping region. A data write operation to the selected memory cells connected to the second word-line WL2 may be performed. A memory cell data write operation of the sub-array 312a may be performed for a write recovery time tWR'. After the write recovery time tWR' elapses, bit lines of the memory cells in the sub-array 312a may be precharged due to a precharge signal PRE1. A bit line precharge operation of the sub-array 312a may be performed for a row precharge time tRP. The active signal ACT2 for the sub-array 312a may be applied again, and the second word-line WL2 may be enabled. A decoded row address dRA2 with a pulse-type for the second word-line WL2 may be applied from a time before the active signal ACT2 is applied to a time after the precharge signal PRE1 is applied.

In the semiconductor memory device 200a, the active signal ACT1 for the sub-array 314a and the active signal ACT2 for the sub-array in the overlappable region may be applied at a tRRD interval, which corresponds to a row active-to-row active time between different banks Therefore, since a continuous data write operation is performed at a tRRD interval, a memory cell data write time tWR' in each data write operation may increase. In addition, a first row cycle time tRC1 for the first word-line WL1 and a second row cycle time tRC2 for the second word-line WL2 outside the keep-away zone may be partially overlapped. As such, a row precharge time tRP for the first word-line WL1 and a word-line enable time tWR' for the second word-line WL2 may be overlapped. Therefore, the semiconductor memory device 200a may compensate for write recovery time tWR parameter increase due to process shrink and may increase a parallelism efficiency.

Figure 18:
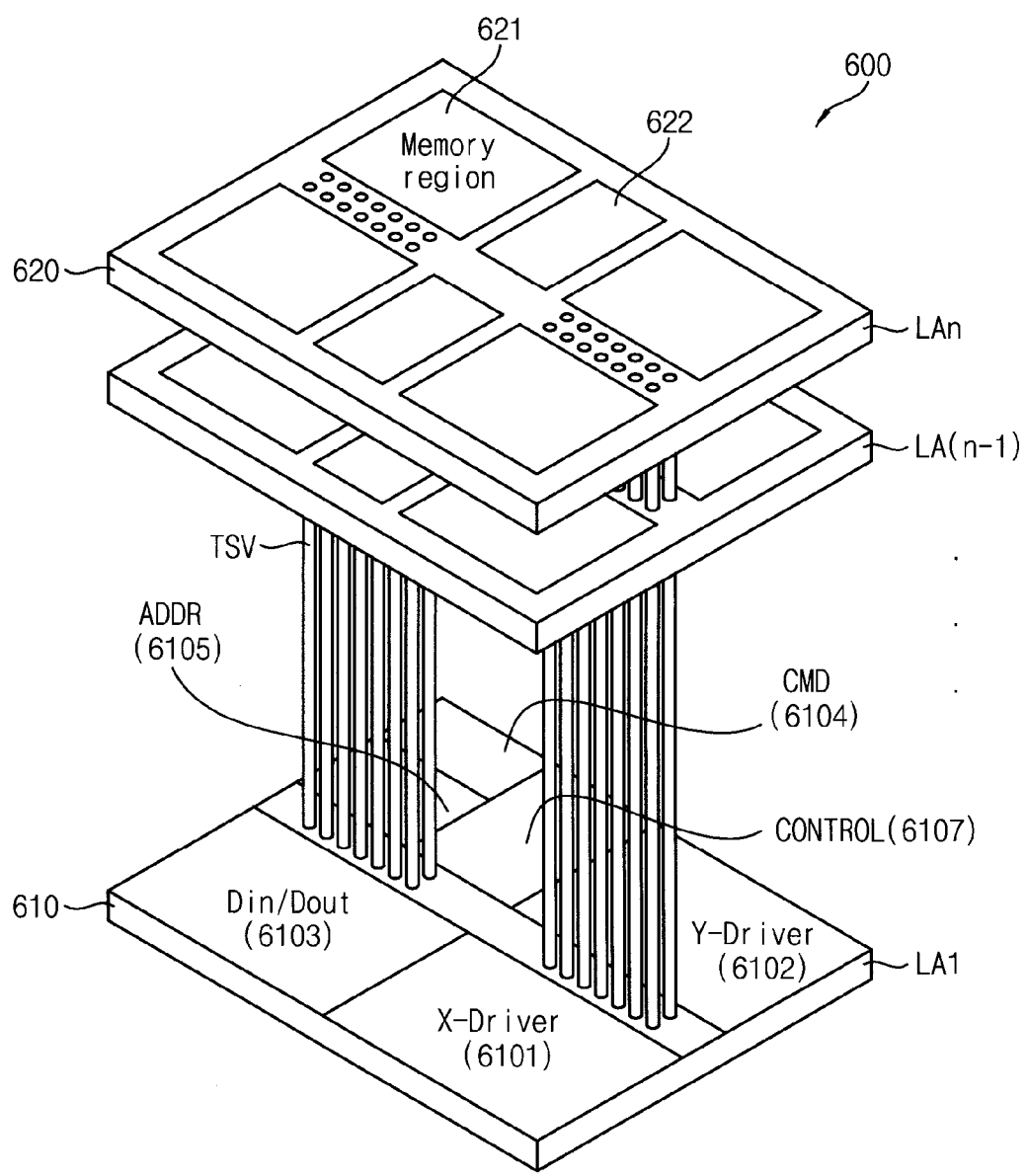
FIG. 18 is a structural diagram illustrating a semiconductor memory device according to example embodiments.

FIG. 18 is a structural diagram illustrating a semiconductor memory device according to example embodiments.

Referring to FIG. 18, a semiconductor memory device 600 may include first through nth semiconductor integrated circuit layers LA1 through LAn, in which the lowest first semiconductor integrated circuit layer LA1 is assumed to be an interface or control chip and the other semiconductor integrated circuit layers LA2 through LAn are assumed to be slave chips including core memory chips. The first through nth semiconductor integrated circuit layers LA1 through LAn may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAn or 620 as the slave chip.

The first semiconductor integrated circuit layer 610 may include various peripheral circuits for driving memory regions 621 provided in the nth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include a plurality of sub-arrays as described with reference to FIGS. 3 through 7.

The first semiconductor integrated circuit layer 610 may further include a control logic 6107. The control logic 6107 may control an access to the memory region 621 based on a command and an address signal from a memory controller. The control logic 6107 may dynamically set a keep-away zone that includes a plurality of memory cell rows which are deactivated based on a first word-line when the first word-line coupled to a first memory cell row of a first sub-array of the plurality of sub-arrays is enabled.

The nth semiconductor integrated circuit layer 620 may include the memory regions 621 including memory cell arrays and peripheral circuit regions 622 in which peripheral circuits for reading/writing data of the memory regions 621, e.g., a row decoder, a column decoder, a bit line sense amplifier, etc. (not illustrated) are arranged.

Figure 19:
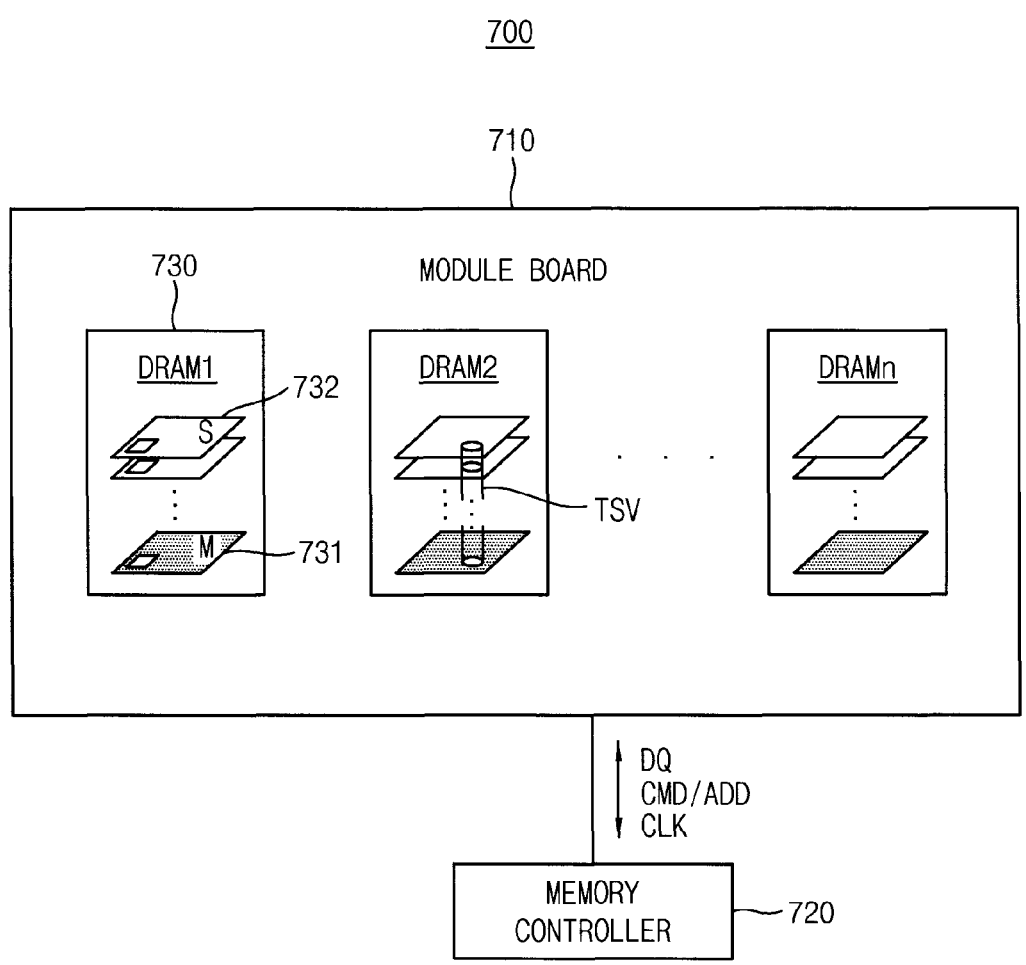
FIG. 19 illustrates a memory system including the semiconductor memory device according to example embodiments.

FIG. 19 illustrates a memory system including the semiconductor memory device according to example embodiments.

Referring to FIG. 19, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 may include a plurality of bank arrays in which a plurality of memory cells are arranged, and a control logic that controls an access to the plurality of bank-arrays. Each of the plurality of bank arrays may include a plurality of sub-arrays as described with reference to FIGS. 3 through 7. The control logic may control the access to the plurality of bank arrays based on a command CMD and an address signal ADD from the memory controller 720. The control logic may dynamically set a keep-away zone that includes a plurality of memory cell rows which are deactivated based on a first word-line when the first word-line coupled to a first memory cell row of a first sub-array of the plurality of sub-arrays is enabled.

The memory module 710 may communicate with the memory controller 720 via a system bus. Data DQ, a command/address CMD/ADD, and a clock signal CLK may be transmitted and received between the memory module 710 and the memory controller 720 via the system bus. Any of the semiconductor memory chips, the semiconductor memory device, or the memory module 710 may be referred to herein as an electronic device.

Figure 20:
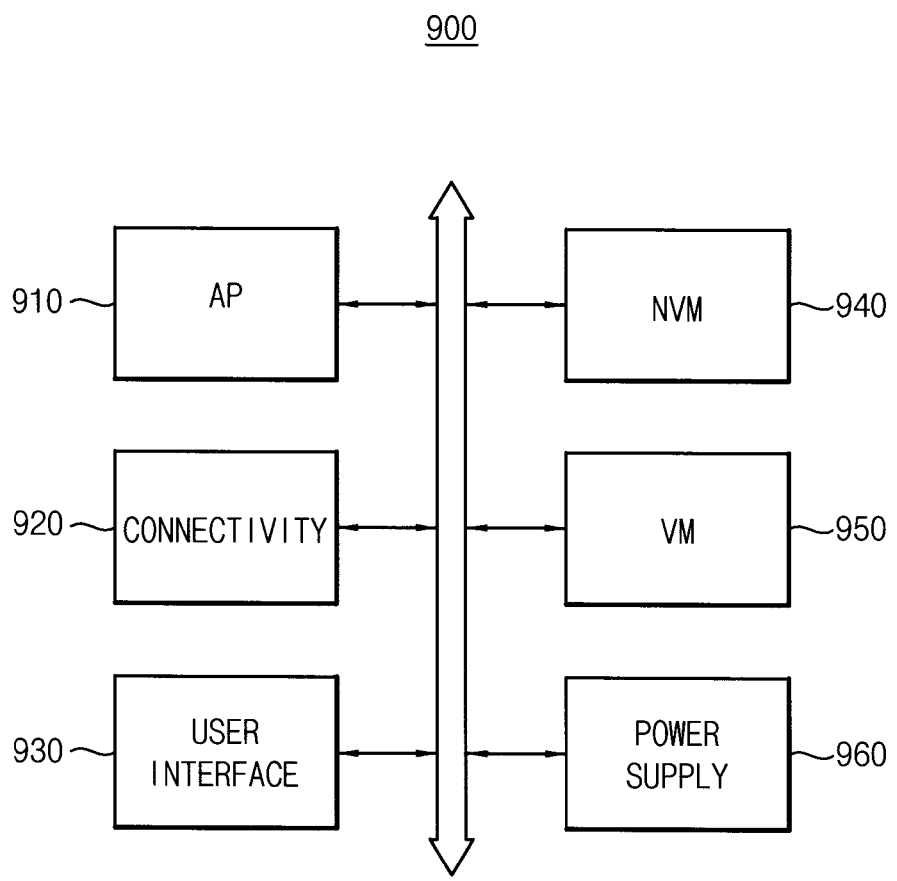
FIG. 20 is a block diagram illustrating a mobile system including the semiconductor memory device according to example embodiments.

FIG. 20 is a block diagram illustrating a mobile system including the semiconductor memory device according to example embodiments.

Referring to FIG. 20, a mobile system 900 may include an application processor 910, a connectivity unit 920, a semiconductor memory device 950, a nonvolatile memory device 940, a user interface 930 and a power supply 960. In some embodiments, the mobile system 900, which may also be referred to as an electronic device, may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, the connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may store data processed by the application processor 910 or operate as a working memory. The semiconductor memory device 950 may be, for example, a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. The semiconductor memory device 950 may employ the semiconductor memory device 200a of FIG. 3. Therefore, the semiconductor memory device 950 may a plurality of bank arrays in which a plurality of memory cells are arranged, and a control logic that controls an access to the plurality of bank-arrays. Each of the plurality of bank arrays may include a plurality of sub-arrays as described with reference to FIGS. 3 through 7. The control logic may control the access to the plurality of bank arrays based on a command and an address signal from the application processor 910. The control logic may dynamically set a keep-away zone that includes a plurality of memory cell rows which are deactivated based on a first word-line when the first word-line coupled to a first memory cell row of a first sub-array of the plurality of sub-arrays is enabled.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 21:
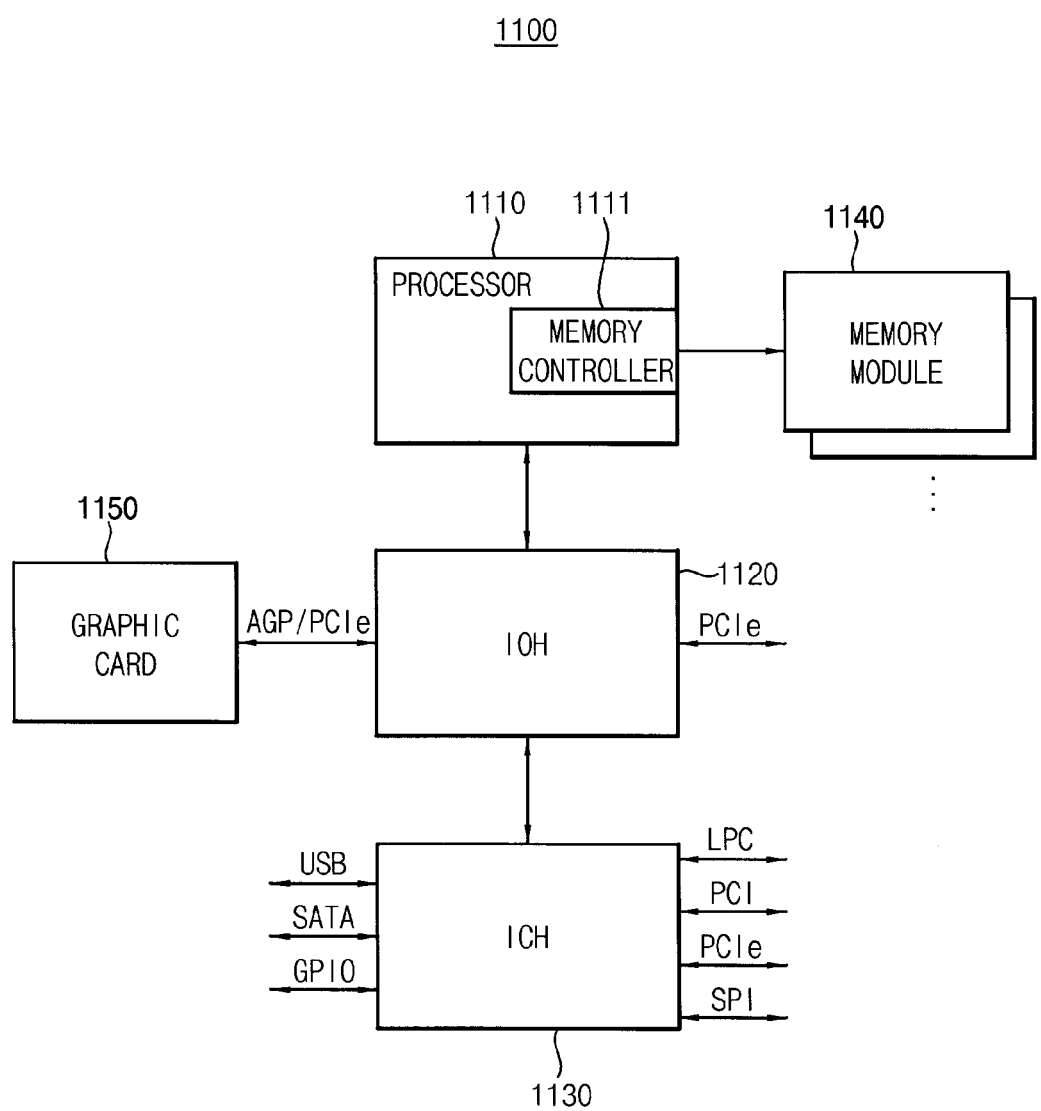
FIG. 21 is a block diagram illustrating a computing system including the semiconductor memory device according to example embodiments.

FIG. 21 is a block diagram illustrating a computing system including the semiconductor memory device according to example embodiments.

Referring to FIG. 21, a computing system 1100 may include a processor 1110, an input/output hub (IOH) 1120, an input/output controller hub (ICH) 1130, at least one memory module 1140 and a graphics card 1150. In some embodiments, the computing system 1100 may be an electronic device such as a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a plurality of bank arrays in which a plurality of memory cells are arranged, and a control logic that controls an access to the plurality of bank-arrays. Each of the plurality of bank arrays may include a plurality of sub-arrays as described with reference to FIGS. 3 through 7. The control logic may control the access to the plurality of bank arrays based on a command and an address signal from the memory controller 1111. The control logic may dynamically set a keep-away zone that includes a plurality of memory cell rows which are deactivated based on a first word-line when the first word-line coupled to a first memory cell row of a first sub-array of the plurality of sub-arrays is enabled.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

As mentioned above, a semiconductor memory device may include a plurality of bank arrays in which a plurality of memory cells are arranged and a control logic that controls an access to the plurality of bank-arrays. Each of the plurality of bank arrays may include a plurality of sub-arrays. The control logic may control the access to the plurality of bank arrays based on a command and an address signal. The control logic may dynamically set a keep-away zone including a plurality of memory cell rows which are deactivated based on a first word-line, when the first word-line coupled to a first memory cell row of a first sub-array of the plurality of sub-arrays is enabled. Therefore, the semiconductor memory device may compensate for increased timing parameters due to process shrink, and may increase a parallelism efficiency.

The present disclosure may be applied to systems using memory controllers and semiconductor memory devices. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
   a memory cell array in which a plurality of memory cells are arranged, the memory cell array including a plurality of bank arrays, each of the plurality of bank arrays including a plurality of sub-arrays; and
   a control logic configured to control an access to the memory cell array based on a command and an address signal, the control logic being configured to calculate a distance from an activated first word-line based on a row address of the activated first word-line according to the address signal and dynamically set a region including a first memory cell row of a first sub-array among the plurality of sub-arrays within the distance from the activated first word-line as a keep-away zone,
   wherein the keep-away zone includes a plurality of memory cell rows which are deactivated based on the first word-line when the first word-line is activated, and
   wherein a first row cycle for the first word-line is at least partially overlapped with a second row cycle for a second word-line, the second word-line being coupled to a second memory cell row in a second sub-array among the plurality of sub-arrays, the second sub-array belonging to regions other than the keep-away zone.

2. The semiconductor memory device of claim 1, wherein the control logic is configured to divide the plurality of sub-arrays into a plurality of sub-array groups based on at least one bit of the address signal, the plurality of sub-array groups including a first sub-array group, and
the control logic is configured to set sub-array groups adjacent to the first sub-array group including the first memory cell row as the keep-away zone.

3. The semiconductor memory device of claim 2, wherein the control logic is configured to set the first sub-array group including the first memory cell row as an activated sub-array group.

4. The semiconductor memory device of claim 3, wherein a size of each sub-array group is varied by a mode register set.

5. The semiconductor memory device of claim 3, wherein a size of the activated sub-array group is varied by a mode register set.

6. The semiconductor memory device of claim 2, wherein the at least one bit of the address signal is one or more upper bits of a row address of the address signal.

7. The semiconductor memory device of claim 1, wherein a precharge time of the first row cycle is partially overlapped with a word-line enable time of the second row cycle.

8. The semiconductor memory device of claim 1, further comprising a plurality of row decoders, each of the plurality of row decoders being coupled to a corresponding bank array among the plurality of bank arrays, each of the plurality of row decoders including:
a decoder configured to decode a row address of the address signal to provide a decoded row address; and
a plurality of word-line drivers, each of the plurality of word-line drivers being connected to a corresponding sub-array among the plurality of sub-arrays,
wherein the decoder is configured to commonly apply the decoded row address to the plurality of word-line drivers, and
the control logic is configured to commonly apply an active signal that selects each of the plurality of sub-arrays to the plurality of word-line drivers, and is configured to individually apply to the plurality of word-line drivers precharge signals that reset the plurality of word-line drivers.

9. The semiconductor memory device of claim 8, wherein the active signal and the decoded row address are pulse-type signals.

10. The semiconductor memory device of claim 8, wherein each of the plurality of word-line drivers comprises:
a first p-channel metal oxide semiconductor (PMOS) transistor coupled between a power supply voltage and a first node connected to a corresponding word-line;
a first n-channel metal oxide semiconductor (NMOS) transistor and a second NMOS transistor coupled in series between the first node and a ground voltage; and
a latch coupled to the corresponding word-line, the latch being configured to latch the active signal until the precharge signal is applied.

11. The semiconductor memory device of claim 10, wherein the PMOS transistor has a gate that receives an inverted version of the precharge signal,
the first NMOS transistor has a gate that receives the active signal, and
the second NMOS transistor has a gate that receives the decoded row address.

12. A memory system comprising:
a semiconductor memory device configured to store data, the semiconductor memory device including:
a memory cell array including a plurality of bank arrays, each of the plurality of bank arrays including a plurality of sub-arrays; and
a control logic configured to control an access to the memory cell array based on a command and an address signal, the control logic being configured to calculate a distance from an activated first word-line based on a row address of the activated first word-line according to the address signal and dynamically set a region including a first memory cell row of a first sub-array among the plurality of sub-arrays within the distance from the activated first word-line as a keep-away zone; and
a memory controller configured to control the semiconductor memory device,
wherein the keep-away zone includes a plurality of memory cell rows which are deactivated based on the first word-line when the first word-line is activated.

13. The memory system of claim 12, wherein a first row cycle for the first word-line is at least partially overlapped with a second row cycle for a second word-line, the second word-line being coupled to a second memory cell row in a second sub-array among the plurality of sub-arrays, the second sub-array belonging to regions other than the keep-away zone.

14. The memory system of claim 12, wherein the semiconductor memory device is a dynamic random access memory (DRAM).

15. A memory device comprising:
a memory cell array including a plurality of bank arrays, each of the plurality of bank arrays including a plurality of sub-arrays;
an address register;
a row decoder;
a column decoder; and
a control logic configured to control an access to the memory cell array based on a command and an address signal, the control logic being configured to calculate a distance from an activated first word-line based on a row address of the activated first word-line according to the address signal and dynamically set a region including a first memory cell row of a first sub-array among the plurality of sub-arrays within the distance from the activated first word-line as a keep-away zone,
wherein the keep-away zone includes a plurality of memory cell rows which are deactivated based on the first word-line when the first word-line is activated, and
wherein the control logic is configured to access the first memory cell row and a second memory cell row by partially overlapping a first row cycle for the first word-line with a second row cycle for a second word-line, the second word-line being coupled to the second memory cell row of a second sub-array among the plurality of sub-arrays, the second sub-array being in an overlappable region other than the keep-away zone.

16. The memory device of claim 15, wherein the control logic is configured to divide the plurality of sub-arrays into a plurality of sub-array groups, the plurality of sub-array groups including a first sub-array group, and
the control logic is configured to set sub-array groups adjacent to the first sub-array group including the first memory cell row as the keep-away zone.

17. The memory device of claim 15, wherein a precharge time of the first row cycle is partially overlapped with a word-line enable time of the second row cycle.

* * * * *